United States Patent
Arvin et al.

(10) Patent No.: US 9,401,336 B2
(45) Date of Patent: Jul. 26, 2016

(54) DUAL LAYER STACK FOR CONTACT FORMATION

(71) Applicant: International Business Machines Corporation, Armonk, NY (US)

(72) Inventors: Charles L. Arvin, Savannah, GA (US); Harry D. Cox, Rifton, NY (US); Brian M. Erwin, Lagrangeville, NY (US); Sarah H. Knickerbocker, Hopewell Junction, NY (US); Karen P. McLaughlin, Poughkeepsie, NY (US); David J. Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/532,764

(22) Filed: Nov. 4, 2014

(65) Prior Publication Data

US 2016/0126201 A1    May 5, 2016

(51) Int. Cl.
*H01L 23/00* (2006.01)

(52) U.S. Cl.
CPC ............ *H01L 24/11* (2013.01); *H01L 24/13* (2013.01); *H01L 2224/1183* (2013.01); *H01L 2224/11462* (2013.01); *H01L 2224/11618* (2013.01)

(58) Field of Classification Search
CPC .............. H01L 24/11; H01L 24/13; H01L 2224/11462; H01L 2224/11618; H01L 2224/1183
See application file for complete search history.

(56) References Cited

U.S. PATENT DOCUMENTS

| | | | |
|---|---|---|---|
| 3,934,057 A | 1/1976 | Moreau et al. | |
| 4,780,177 A | 10/1988 | Wojnarowski et al. | |
| 5,028,513 A | 7/1991 | Murakami et al. | |
| 5,545,353 A | 8/1996 | Honda et al. | |
| 5,904,156 A | 5/1999 | Advocate et al. | |
| 6,555,170 B2 | 4/2003 | Taylor | |
| 8,264,072 B2 * | 9/2012 | Schneegans | H01L 23/53238 257/676 |
| 8,587,120 B2 * | 11/2013 | Choi | H01L 23/3171 257/737 |
| 8,658,583 B2 | 2/2014 | Lee | |
| 2002/0068684 A1 | 6/2002 | Peters et al. | |
| 2004/0234904 A1 | 11/2004 | Rieker et al. | |
| 2006/0043070 A1 | 3/2006 | Moore | |

(Continued)

FOREIGN PATENT DOCUMENTS

GB    EP 2098911 B1    3/2009
JP    5423992 B2    2/2014

OTHER PUBLICATIONS

Sricharoenchaikit, "Building Solder Bumps on GaAs Flip Chip Schottky Devices", in Proc. of Int. Conf. on Compound Semiconductors (2003), from weblink: http://www.csmantech.org/Digests/2003/2003PDF/8-19.PDF (4 pages).

(Continued)

*Primary Examiner* — Latanya N Crawford
(74) *Attorney, Agent, or Firm* — Matthew C. Zehrer

(57) ABSTRACT

A semiconductor structures includes a contact fabricated utilizing a multi material trench-layer. The multi material trench layer is utilized to form a contact trench and the contact trench is utilized to form the contact therein. The trench-layer includes a lower barrier trench layer and an upper photoprocessing layer. The photoprocessing layer is utilized pattern and form contact trench. The barrier layer protects an electroplating conductive layer utilized in forming the contact from corrosion that may occur during the removal of the photoprocessing layer.

17 Claims, 6 Drawing Sheets

(56) References Cited

U.S. PATENT DOCUMENTS

| | | |
|---|---|---|
| 2006/0094613 A1 | 5/2006 | Lee |
| 2006/0175290 A1 | 8/2006 | Lee et al. |
| 2007/0026631 A1* | 2/2007 | Lin .................. H01L 23/3157 438/424 |
| 2009/0102032 A1* | 4/2009 | Schneegans ...... H01L 23/53238 257/676 |
| 2012/0064712 A1* | 3/2012 | Lei .................... H01L 21/67028 438/614 |
| 2012/0211900 A1* | 8/2012 | Choi .................. H01L 24/03 257/782 |
| 2013/0026621 A1* | 1/2013 | Tsai .................. H01L 24/13 257/737 |
| 2013/0062755 A1* | 3/2013 | Kuo .................. H01L 24/14 257/737 |
| 2013/0099380 A1* | 4/2013 | Chen .................. H01L 24/11 257/738 |

OTHER PUBLICATIONS

Atkinson et al., "Cathodic delamination of methly methacrylate-based dry film polymers on copper", IBM J. Res Develop, vol. 29, No. 1, pp. 27-36 (1985).

Petit, et al., "Eliminating solvents in resist removal processes using low-cost detergents", In IEEE/SEMI Advanced Semiconductor Manufacturing Conference (ASMC 2010), pp. 301-306 (2010).

Michael Carano, "The evolution of organic solderability preservatives (OSP) from a temporary protectant to a leadership position in surface finishing chemistry", Circuit World, vol. 37 Iss: 2, pp. 12-19, (2011).

* cited by examiner

DUAL LAYER STACK FOR CONTACT FORMATION

FIELD

Embodiments of invention generally relate to semiconductor devices, design structures for designing a semiconductor device, and semiconductor device fabrication methods. More particularly, embodiments relate to a contact structure (e.g. pillar, pad, etc.) interconnect for semiconductor chip-to-package applications.

BACKGROUND

A contact is a semiconductor chip-to-package interconnect technology. The advantages in the contacts lie in the extendibility to finer pitch and the superior electromigration performance. The contacts may be made from copper and the finer pitch is due to the contact's vertical sidewall.

In traditional copper contact technology, the contacts are formed upon a semiconductor wafer via photoresist defined plating. Typically, a dual layer of sputtered metals is formed upon the semiconductor, a photoresist layer is formed upon the dual layer, and the photoresist layer is patterned. The contact is electroplated within the patterned photoresist. Subsequent to plating, the photoresist is stripped from the semiconductor wafer utilizing a photoresist stripping solution.

The bottom metal layer is typically used as both a barrier and an adhesion layer to the underlying wafer material(s). The second layer is a current carrying or seed layer which is typically some form of copper or copper alloy utilized in the contact electroplating fabrication.

These dual metal layers are particularly beneficial when lead plating due to the high activation energy needed to be overcome for lead ions to deposit as lead in the absence of tin. The Restriction of Hazardous Substances Directive (RoHS) restricts the use of certain hazardous substances in electrical and electronic equipment and has driven the electronics industry to move away from solders that contain lead. Therefore, as tin based plating has become prevalent, it has been found that tin is more noble in solutions than copper and has a low activation energy for tin ions to convert to tin (i.e., $Sn^{2+}+2e^-\rightarrow Sn$). As a result, tin can deposit onto the exposed seed layer to which the photoresist has been applied.

When tin is present on the surface of the seed layer, it lowers the activation barrier needed for lead ions to deposit onto a surface. As a result, the seed layer becomes covered with metal species (e.g., $Cu_3Sn$, $SnO$, $SnO_2$, $Pb$, etc.) that inhibit or may not be removed with photoresist stripping solutions. One resolution to prevent the metal specie deposition upon the seed layer is to segregate lead wafers (e.g., semiconductor wafers utilizing lead) from lead free wafers for stripping and to utilize a nitrogen or argon ash to remove the deposited metal specie from the seed layer prior to etching. However, this resolution leads to the metal species depositing onto the walls of the ash chamber that require increased costly chamber wall kit changes.

SUMMARY

In an embodiment of the present invention, a semiconductor device fabrication method includes forming a liner layer upon a dielectric layer, forming an electrically conductive plating layer upon the liner layer, forming an epoxy trench barrier layer upon the plating layer, forming a photoprocessing layer upon the epoxy trench barrier layer, and forming a contact trench within the photoprocessing layer and the epoxy trench barrier layer, the contact trench exposing a portion of the electrically conductive plating layer.

In another embodiment of the present invention, a semiconductor device fabrication method includes forming a liner layer upon a dielectric layer, forming an electrically conductive plating layer upon the liner layer, forming an organic material (OM) trench barrier layer upon the plating layer, forming a photoprocessing layer upon the OM trench barrier layer, and forming a contact trench within the photoprocessing layer and the OM trench barrier layer, the contact trench exposing a portion of the electrically conductive plating layer.

In yet another embodiment of the present invention, a semiconductor structure includes a semiconductor substrate, a liner layer upon the substrate, an electrically conductive plating layer upon the liner layer, a trench barrier layer upon the plating layer, a photoprocessing layer upon the trench barrier layer, and a contact within a contact trench, the contact trench positioned within the photoprocessing layer and the trench barrier layer and exposes a portion of the electrically conductive plating layer.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures or methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor structures including contacts fabricated utilizing multi material trench-layer for forming the contact structures therein. The trench-layer includes a barrier trench layer and a photoprocessing layer. The photoprocessing layer is utilized to form the contact trench and the barrier layer protects the electroplating seed layer from becoming covered with metal species during the removal of the photoprocessing layer.

Referring now to the FIGS., wherein like components are labeled with like numerals, exemplary fabrication steps and corresponding structure in accordance with embodiments of the present invention are shown, and will now be described in greater detail below. It should be noted that some of the FIGs depict cross section views. Furthermore, it should be noted that while this description may refer to components in the singular tense, more than one component may be depicted throughout the figures or a real world implementation of the embodiments of the present invention. The specific number of components depicted in the figures and the cross section orientation was chosen to best illustrate the various embodiments described herein.

Figure 1:
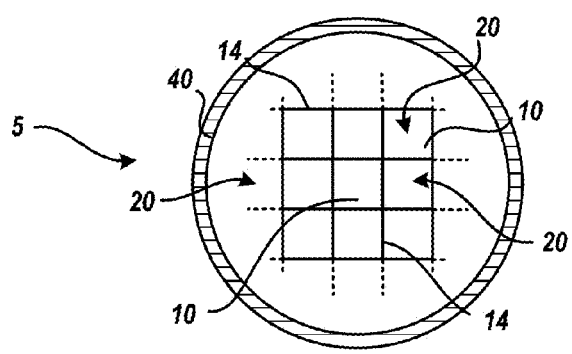
FIG. 1 depicts an exemplary semiconductor wafer that may include one or more embodiments.

FIG. 1 depicts a semiconductor structure, such as a semiconductor wafer 5, in accordance with various embodiments of the present invention. Wafer 5 may include a plurality of chips 10 separated by kerfs 14. Each chip 10 may include an active region 20 wherein integrated circuit devices, microelectronic devices, etc. may be built using microfabrication process steps such as doping or ion implantation, etching, deposition of various materials, photolithographic patterning, electroplating, etc. Wafer 5 may also includes a perimeter edge region 40 that is free of material where an electrodeposition tool electrically contacts a conductive layer 15 of wafer 5 for electroplating contacts thereon.

FIG. 2-FIG. 9 show processes and respective semiconductor structures in accordance with various embodiments of the invention. In particular, FIG. 2 a shows a semiconductor structure at an initial stage of fabrication. The structure includes a liner 10 such as, for example, titanium, titanium tungsten, titanium tungsten chrome, and copper, etc., formed upon a dielectric layer 8, such as a semiconductor substrate. In a particular embodiment, liner 10 is a titanium tungsten layer. In embodiments, the liner 10 can be, for example, about 0.165 microns thick, but can range from about 0.125 to 0.205 microns in thickness, amongst other desirable dimensions. In embodiments, the liner 10 can act as an adhesion layer to the underlying dielectric layer 8, a barrier layer to prevent contact material, solder, etc. from becoming in contact with the underlying dielectric layer 8, semiconductor components, etc. In various embodiments, dielectric layer 8 may include an inter-dielectric contact 13 that may be electrically connected with an integrated circuit device, microelectronic device, etc.

Figure 2:
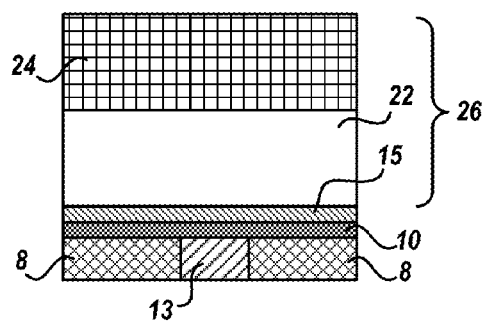
FIG. 2-FIG. 9 depicts fabrication processes stages to form exemplary contact structures and associated semiconductor structures, according to embodiments of the invention.

Still referring to FIG. 2, a conductive layer 15 is formed upon the liner 10 using e.g. conventional processes. For example, the conductive layer 15 can be deposited using a sputtering technique or other known metal deposition techniques. In embodiments, the conductive layer 15 may be, for example, copper or other conductive materials such as, for example, nickel, nickel alloys, copper alloys, etc. In a particular embodiment, the conductive layer 15 is copper. The conductive layer 15 may be about 0.45 microns thick; although other dimensions are also contemplated by the present invention such as, for example, a range of about between 0.1 to 0.6 microns. In certain embodiments, conductive layer 15 is utilized as a shorting layer where electrical contact is made with a plating tool during plating operations to e.g. form contact structures upon the semiconductor chip, etc.

Still referring to FIG. 2, a multi material trench-layer 26 is formed. The trench-layer 26 includes a barrier trench layer 22 and a photoprocessing layer 24. The barrier trench layer 22 is formed upon the conductive layer 15 using e.g. conventional processes. In certain embodiments, barrier trench layer 22 is maintained during photoresist removal by photoresist stripping solutions. In certain embodiments, barrier trench layer 22 may be photo-patterned. Still in certain embodiments, barrier trench layer 22 may be tone and develop solution matched to photoprocessing layer 24.

In certain embodiments, barrier trench layer 22 may be a patternable passivation polymer applied upon conductive layer 15 and soft baked. For example the barrier trench layer 22 material may be an epoxy. In certain embodiments, the barrier trench layer 22 material may be an epoxy that is a photo definable polymer, having a low cure temperature (e.g., 100 to 250 degrees Celsius, etc.), limited outgassing on cure (e.g., if too much outgassing were to occur it could create voids or flow in the photoprocessing layer 24 layer, create added roughness, material flow/displacement, mixing of photoprocessing layer 24 layer and barrier trench layer 22, etc.), and have a reasonable aggressive chemistry after cure so as to be resistant to the stripping solutions used to remove photoprocessing layer 24. Certain epoxy materials may be either a positive- or negative-tone developable material using a 2.38 wt % TMAH solution and may be cured around 200 degrees Celsius and have limited mass loss during the cure process. In certain embodiments, the barrier trench layer 22 protects the conductive layer 15. The barrier trench layer 22 may be about 1 micron thick; although other dimensions are also contemplated by the present invention such as, for example, a range of about between 0.25 to 2.5 um thick.

In certain embodiments, photoprocessing layer 24 may be a photoresist applied upon barrier trench layer 22 and soft baked. For example, a photoresist material may be deposited on the barrier trench layer 22 using conventional deposition techniques such as, for example, dry film lamination, spin on liquid resist, etc. In certain embodiments the photoresist is the same tone as barrier trench layer 22 and utilizes the same develop chemistry as barrier trench layer 22. By utilizing a similar tone, a single photolithography pass may be utilized to pattern the multi material trench-layer 26. In certain embodiments, the photoprocessing layer 24 is maintained at temperatures approaching the cure temperature of the barrier trench layer 22. The photoprocessing layer 24 may be about 50 micron thick; although other dimensions are also contemplated by the present invention such as, for example, a range of about between 1 to 150 um thick.

Figure 3:
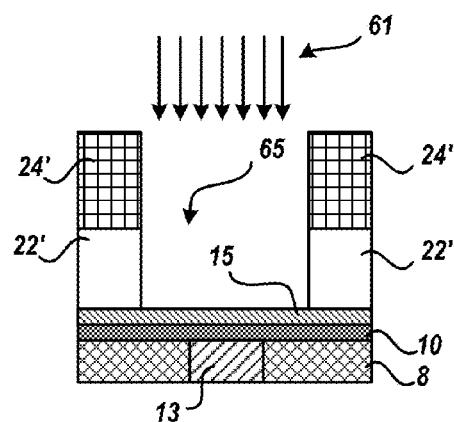

FIG. 3 shows a semiconductor structure at a stage of fabrication wherein a contact trench 65 is formed. At the present stage of fabrication, the multi material trench-layer 26 is subjected to conventional lithographic and etching processes 61 to remove a portion of the multi material trench-layer 26 to form an opening or trench 65 that exposes conductive layer 15 therein. In certain embodiments, multi material trench-layer 26 is exposed in such a manner to co-expose the photoprocessing layer 24 and barrier trench layer 22 to allow trench 65 to be formed. In certain embodiments, an oxygen, argon/oxygen, etc. reactive ion etch (RIE) ash may be performed to refresh the trench 65 surfaces prior to contact formation therein. The remaining photoprocessing layer 24 material and remaining barrier trench layer 22 material forming trench 65 sidewalls is denoted as photoprocessing layer 24' and barrier trench layer 22'.

Figure 4:
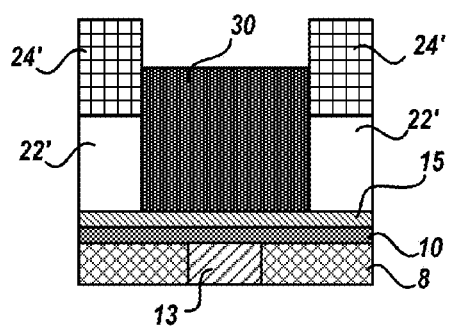

FIG. 4 shows a semiconductor structure at a stage of fabrication wherein a contact 30 is formed within trench 65. In embodiments, the upper surface of contact 30 may be subjected to a RIE process to clean the surface thereof. Contact 30 may be a copper, or copper alloy such as, for example, nickel, iron, cobalt, etc. formed within trench 65 and is in contact with the conductive layer 15. In various embodiments, contact 30 is formed by electro plating operations wherein an electro deposition tool contacts conductive layer 15 within perimeter region 40. Contact 30 may be a pillar contact about 40 microns in thickness; although other dimensions are also contemplated by the invention such as, for example, a range of about between 20 to 60 microns. In certain embodiments contact 30 may be formed as a contact pad of less thickness than 20 to 60 microns, etc.

In some embodiments a plate (not shown) may be formed on contact 30 within trench 65. More particularly, a metal plate may be deposited on contact 30 using, for example, another plating operation(s). In embodiments, the plate provides a wettable surface for connection solder. The metal plate can be, for example, palladium, gold, or copper, for example, depending on the processes used to deposit the soldering. For example, in C4NP (C4 New Process) processes, the metal plate can be either gold or copper; whereas, in a solder plating technique, the metal plate is copper. In embodiments, the plate may be subjected to a RIE process to clean the surface thereof. The plate can have an overall thickness in the range of about 0.01 microns to about 3 micron. In some embodiments, solder (not shown) may be formed on the plate or contact 30. More particularly, solder is deposited using, for example, another plating operation(s). In certain embodiments, solder may be a tin-silver solder alloy solder, a tin-silver-copper alloy solder, etc. The solder may be about 20 microns in thickness; although other dimensions are also contemplated by the invention such as, for example, a range of about between 2 to 30 microns.

Figure 5:
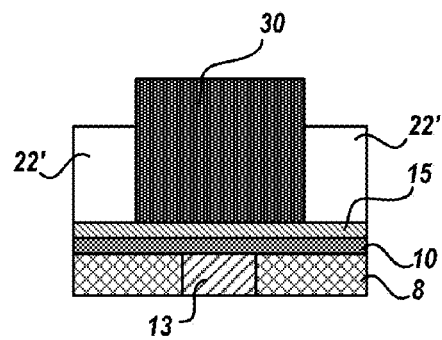

FIG. 5 shows a semiconductor structure at a stage of fabrication wherein photoprocessing layer 24' is removed. The photoprocessing layer 24' may be stripped using conventional photoresist strippers. For example, the photoprocessing layer 24' can be stripped using TMAH with a high pH content, with glycol to assist in swelling and NMP to aid in dissolution. Alternatively, the photoprocessing layer 24' can be stripped using sodium or potassium hydroxide. During the photoprocessing layer 24' removal the barrier trench layer 22' is a barrier to prevent the photoresist stripping solution from contacting conductive layer 15. As such, the conductive layer 15 is protected from metal species such as $Cu_3Sn$, $SnO$, $SnO_2$, Pb, etc. within the photoresist stripping solution from being deposited thereon by barrier trench layer 22'.

Figure 6:
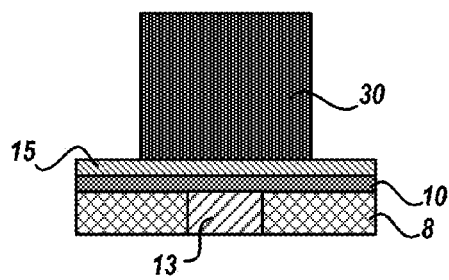

FIG. 6 shows a semiconductor structure at a stage of fabrication wherein barrier trench layer 22' is removed. The barrier trench layer 22' may be removed using conventional and a wet etch, dry etch, or combination removal processes. For example, the barrier trench layer 22' may be removed utilizing an oxygen based RIE, laser based ablative photodecomposition (APD), etc.

Figure 7:
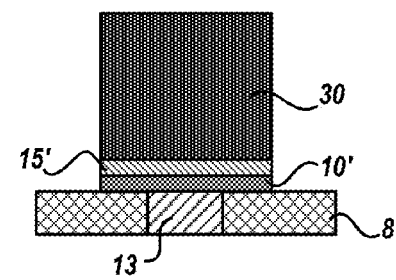

FIG. 7 shows a semiconductor structure at the state of fabrication wherein portions of conductive layer 15 and/or portions of the liner 10 are removed. Conductive layer 15 and liner 10 may be removed by, for example, utilizing a wet etch, dry etch, or combination. In other embodiments, portions of conductive layer 15 may be removed by other known processes such as, for example, liquid or gas flux techniques. In certain embodiments only the portions of conductive layer 15 (as opposed to portions of conductive layer 15 and portions of liner 10, etc.) exterior to contact 30 are removed. In such embodiments, liner 10 may be retained to e.g. limit pillar contact undercuts, etc. and removed in later fabrication stages, etc.

Upon the removal of photoprocessing layer 24', barrier trench layer 22' and portions of conductive layer 15 and/or liner 10 contact 30 is formed and may include a retained contact, pad (not shown), solder (not shown), etc. The width/diameter of contact 30 is generally similar to the width of the trench 65. In certain embodiments, an argon, oxygen, etc. RIE ash may be performed to refresh the retained surfaces of semiconductor structure subsequent to the removal of photoprocessing layer 24', barrier trench layer 22', and/or removal of the portions of conductive layer 15 and liner 10. The contact 30 shown in FIG. 7 may be formed by other known or additional techniques than those described without deviating from the spirit of those embodiments herein claimed.

Figure 8:
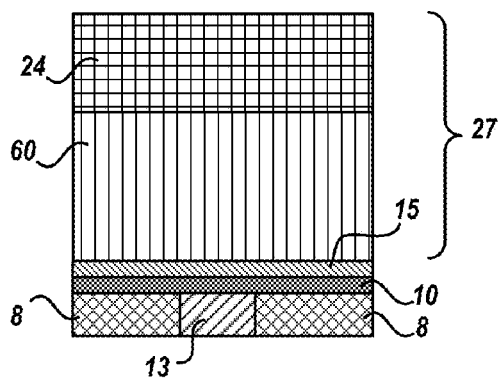

FIG. 8 shows a semiconductor structure at an initial stage of fabrication. A multi material trench-layer 27 is formed. The trench-layer 27 includes a barrier trench layer 60 and a photoprocessing layer 24. The barrier trench layer 60 is formed upon the conductive layer 15 using e.g. conventional processes. In certain embodiments, barrier trench layer 60 is maintained during photoresist removal by photoresist stripping solutions. In certain embodiments, barrier trench layer 60 may be photo-patterned. Still in certain embodiments, barrier trench layer 60 may be tone and develop solution matched to photoprocessing layer 24.

In certain embodiments, barrier trench layer 60 may be a patternable OM protectant applied upon conductive layer 15. For example the barrier trench layer 60 material may be a copper Organic Surface Preservative also known as Organic Solderability Preservatives (OSP) that uses a water-based organic compound that selectively bonds to copper and provides an organometallic layer that protects the underlying conductive layer 15. In other embodiments, layer 60 may be benzocyclobutene (BCB), polynorbornene (PNB), or other similar materials. The barrier trench layer 60 may be about 1 micron thick; although other dimensions are also contemplated by the present invention such as, for example, a range of about between 0.25 to 2.5 um thick.

In certain embodiments, photoprocessing layer 24 may be a photoresist applied upon barrier trench layer 60 and soft baked. For example, a photoresist material may be deposited on the barrier trench layer 60 using conventional deposition techniques such as, for example, dry film lamination, spin on liquid resist, etc. In certain embodiments the photoresist is the same tone as barrier trench layer 60 and utilizes the same develop chemistry as barrier trench layer 60. By utilizing a similar tone, a single photolithography pass may be utilized to pattern the multi material trench-layer 27.

Figure 9:
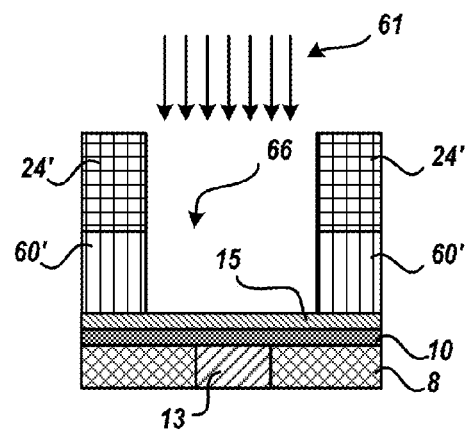

FIG. 9 shows a semiconductor structure at a stage of fabrication wherein a contact trench 66 is formed. At the present stage of fabrication, the multi material trench-layer 27 is subjected to conventional lithographic and etching processes 61 to remove a portion of the multi material trench-layer 27 to form an opening or trench 66 that exposes conductive layer 15 therein. In certain embodiments, multi material trench-layer 27 is exposed in such a manner to co-expose the photoprocessing layer 24 and barrier trench layer 60 to allow trench 66 to be formed. In certain embodiments, an oxygen, argon, etc. RIE ash may be performed to refresh the trench 66 surfaces prior to contact formation therein. The remaining photoprocessing layer 24 material and remaining barrier trench layer 60 material forming trench 66 sidewalls is denoted as photoprocessing layer 24' and barrier trench layer 60'.

A contact 30 may be formed within trench 66. The contact 30 may be formed by electro plating operations wherein an electro deposition tool contacts conductive layer 15 within perimeter region 40. In some embodiments a plate may be formed on the contact 30 within trench 66. In some embodiments, solder may be formed on the plate or contact 30 within trench 66. Subsequent the formation of the contact within trench 66 the photoprocessing layer 24' may be stripped using conventional photoresist strippers. During the photoprocessing layer 24' removal the barrier trench layer 60' is a barrier to prevent the photoresist stripping solution from contacting conductive layer 15. As such, the conductive layer 15 is protected from metal species such as $Cu_3Sn$, SnO, $SnO_2$, Pb, etc. within the photoresist stripping solution from being deposited thereon by barrier trench layer 60'.

Subsequent to the removal of photoprocessing layer 24' barrier trench layer 60' is removed. The barrier trench layer 60' may be removed using conventional solvent, ash, or etching (e.g., wet etch, dry etch, or combination) removal processes. For example, the barrier trench layer 60' may be removed by etching utilizing a 5% sulfuric acid etchant to remove barrier trench layer 60'. Subsequent to the removal of barrier trench layer 60', portions of conductive layer 15 and/or portions of the liner 10 are removed. Upon the removal of photoprocessing layer 24', barrier trench layer 60' and portions of conductive layer 15 and/or liner 10, a contact 30 is formed and may include a retained contact, pad, solder, etc. The width/diameter of contact 30 is generally similar to the width of the trench 66. In certain embodiments, an argon/oxygen or nitrogen RIE ash may be performed to refresh the retained surfaces of semiconductor structure subsequent to the removal of photoprocessing layer 24', barrier trench layer 60', and/or removal of the portions of conductive layer 15 and liner 10.

In certain embodiments, the barrier trench layer 60 is in direct contact with solder and upon the organic of the barrier trench layer 60 is burnt off allowing the solder to react with the e.g., copper. In some embodiments, if the barrier trench layer 60 is not fully removed, it may be in direct contact with another metal that does not melt and has no opportunity to pull in the Cu-OSP interface.

Figure 10:
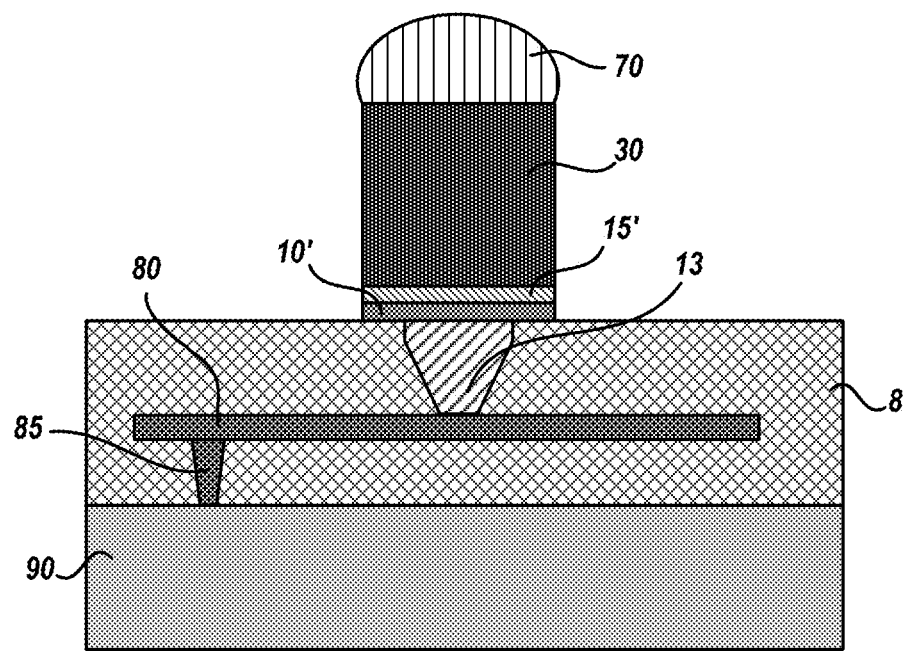
FIG. 10 depicts a semiconductor device including a contract structure, according to embodiments of the invention.

FIG. 10 shows an exemplary semiconductor structure implementing contact 30. Although FIG. 10 shows a single contact, it should be understood by those of skill in the art that a plurality of contacts can be formed on the surface of the structure using the fabrication processes above. In the example of FIG. 10, one or more dielectric layers 8 are formed upon a semiconductor substrate 90. The substrate 90 may be, for example, silicon or other known substrates for semiconductor devices. A metal interconnect(s) 85 and connecting metal line(s) 80 may be formed in the one or more dielectric layers 8 using conventional damascene and deposition processes. A inter dielectric contact 13 (e.g. via, etc.) is formed in the dielectric layers 8 and the liner 10 may be formed thereon. In embodiments, liner 10 is in contact with the underlying wiring line 80. The contact 30 is formed in accordance with the various embodiments as described herein.

Figure 11:
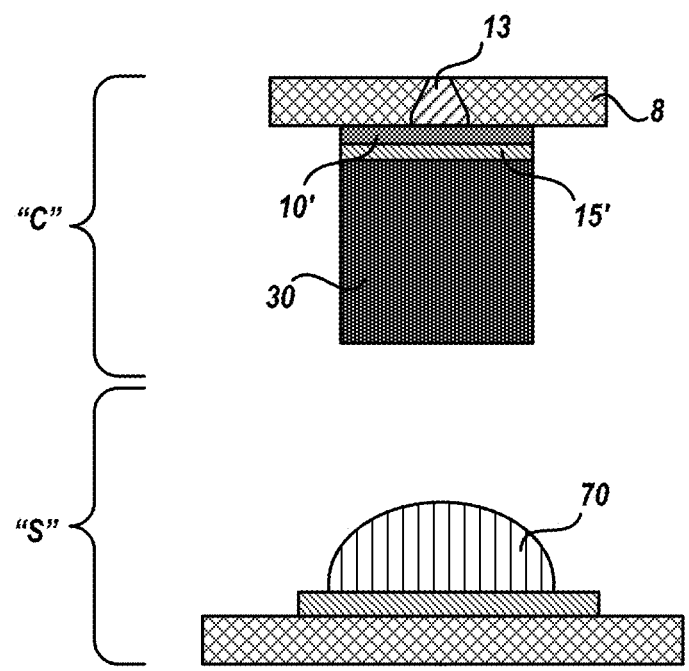
FIG. 11 depicts a semiconductor chip-to-package interconnect, according to embodiments of the invention.

In embodiments of the invention, solder 70 may be connected to the chip or to a carrier or package substrate. For example, solder can be applied to the package substrate in almost all instances, with the exception of some ceramic carriers. It is contemplated that the solder can be attached to the contact 30 comprised within a chip (e.g. see FIG. 10, etc.) or from the package or carrier (e.g. see FIG. 11, etc.). Therefore, in embodiments, contact 30 can be completely devoid of any solder 70 and still be joined to the package or carrier. By way of example, FIG. 11 shows a chip "C" and a package substrate "S". Solder 70 is provided on the package substrate S for joining the chip "C" and package substrate "S". As noted above, the contact 30 of the chip does not need solder, as it can connect to e.g. a contact pad upon the package substrate with the solder 70 on the substrate S.

Figure 12:
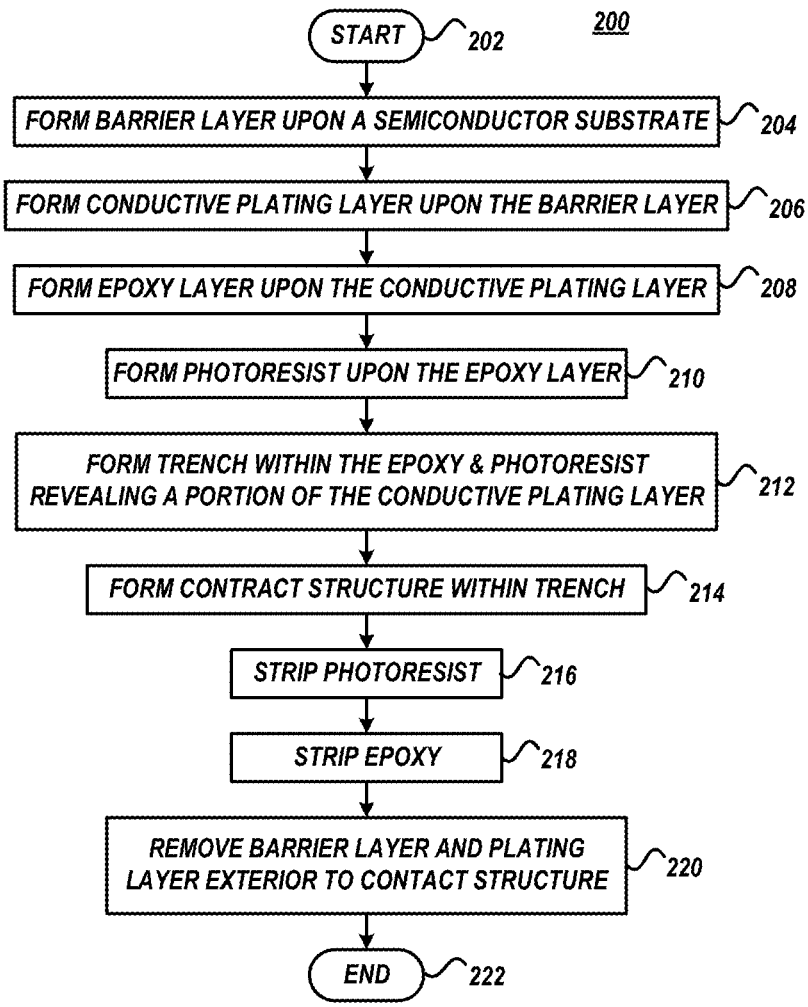
FIG. 12 and FIG. 13 depict exemplary semiconductor device fabrication flow methods, according to embodiments of the invention.

FIG. 12 depicts an exemplary semiconductor device fabrication method 200, in accordance with various embodiments of the present invention. Method 200 may be utilized in implementations where it may be beneficial to form electrical contacts (e.g. pillars, pads, etc.) utilizing a multiple material trench layer wherein a bottom trench layer formed upon a conductive layer protects the conductive layer while a top trench layer is removed subsequent to the formation of the electrical contact.

Method 200 begins at block 202 by forming a barrier layer upon a dielectric such as a semiconductor substrate (block 204). More particularly, liner 10 may be formed on dielectric layer 8. Method 200 may continue by forming a conductive plating layer 15 upon the barrier layer (block 206). More particularly conductive layer 15 may be formed upon liner 10. For example, liner 10 and conductive layer 15 may be sputtered onto semiconductor wafer 5.

Method 200 may continue with forming an epoxy trench barrier layer upon the conductive plating layer 15 (block 208). For example, an epoxy trench barrier layer 22 may be applied upon the semiconductor wafer 5 and soft baked, fully cured, etc.

Method 200 may continue by forming a photoresist upon the epoxy trench barrier layer (block 210). More particularly, photoresist material may be deposited on epoxy trench barrier layer 22 forming a multi material trench layer 26. Method 200 may continue by subjecting photoresist material and epoxy trench barrier layer 22 to lithographic and etching processes (e.g. bake, expose, develop, etc.) to form a trench revealing a portion of the conductive plating layer (block 212). More particularly, a contact trench 65 may be formed by removing a portion of photoprocessing layer 24 and corresponding portion of epoxy trench barrier layer 22 that exposes a portion of the conductive layer 15. The sidewalls of the remaining portions of photoprocessing layer 24' and trench barrier layer 22' may form the sidewalls of trench 65 and the upper surface of the exposed conductive layer 15 may form the bottom of trench 65. The trench sidewalls may be e.g. refreshed with an etching process (e.g., an oxygen RIE, an argon and oxygen RIE, etc.) prior to forming the contact therein.

Method 200 may continue by forming a contact structure within the trench (block 214). For example, contact 30 may be formed by depositing (e.g. electrodeposition plating, etc.) copper within trench 65. An electrodeposition tool may contact conductive layer 15 within perimeter region 40 of wafer 5.

Method 200 may continue with removing photoresist (block 216). For example, photoprocessing layer 24' may be stripped with a photoresist stripping solution. Since the epoxy barrier trench layer remains, the conductive layer 15 is protected from metal species such as $Cu_3Sn$, SnO, $SnO_2$, Pb, etc. within the photoresist stripping solution from being deposited thereon by e.g. barrier trench layer 22'.

Method 200 may continue with removing the epoxy barrier trench layer (block 218). For example, trench barrier layer 22' may be stripped with an etching process (e.g., oxygen RIE, etc.). In certain embodiments, such removal process eliminates aggressive nitrogen etches that result in the removal of metal species such as $CU_3Sn$, SnO, $SnO_2$, Pb, etc. from the structure that, in turn, deposit upon chamber walls. Thus, reduced chamber wall kit changes may be achieved. Further, such removal processes may eliminate the need to segregate leaded wafers and non lead wafers during photoresist stripping operations.

Method 200 may continue with removing the barrier layer and/or plating layer exterior to the contact (block 220). For example, the liner 10 and the conductive layer 15 may be removed such that the sidewalls of the liner 10 and the sidewalls of the conductive layer 15 are coplanar with the sidewalls of contact 30. Method 200 ends at block 222.

Figure 13:
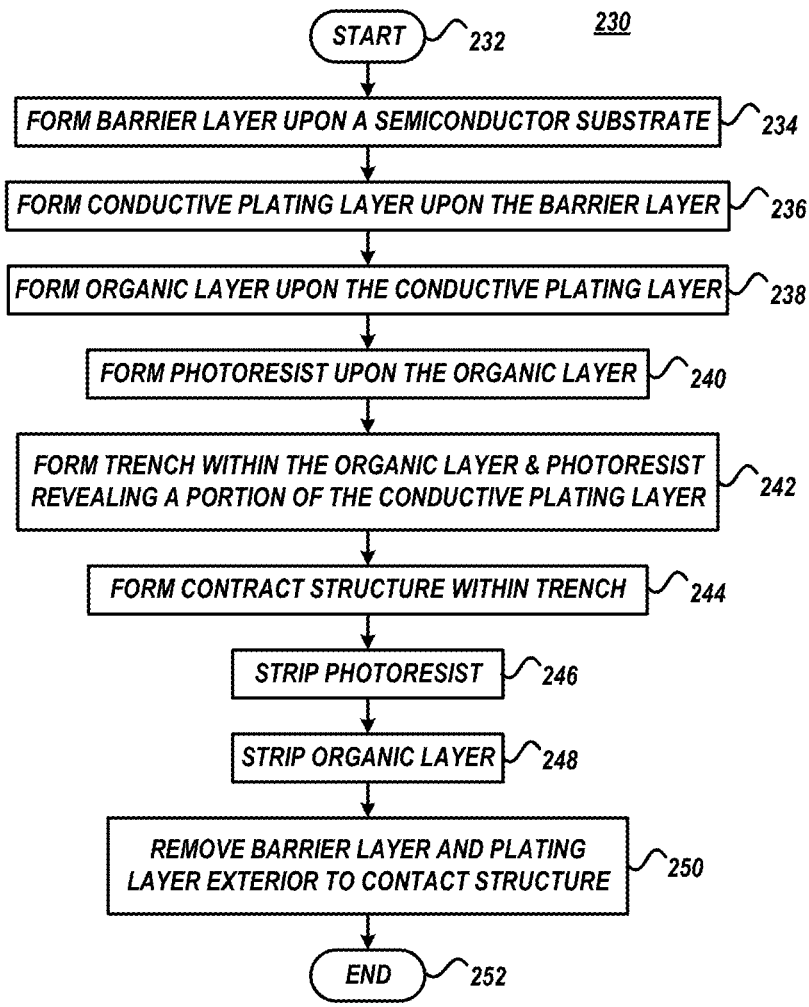

FIG. 13 depicts an exemplary semiconductor device fabrication method 230, in accordance with various embodiments of the present invention. Method 230 may be utilized in implementations where it may be beneficial to form electrical contacts (e.g. pillars, pads, etc.) utilizing a multiple material trench layer wherein a bottom trench layer formed upon a conductive layer protects the conductive layer while a top trench layer is removed subsequent to the formation of the electrical contact.

Method 230 begins at block 232 by forming a barrier layer upon a dielectric such as a semiconductor substrate (block 234). More particularly, liner 10 may be formed on dielectric layer 8. Method 230 may continue by forming a conductive plating layer 15 upon the barrier layer (block 236). More particularly conductive layer 15 may be formed upon liner 10. For example, liner 10 and conductive layer 15 may be sputtered onto semiconductor wafer 5.

Method 230 may continue with forming an organic barrier layer upon the conductive plating layer 15 (block 238). For example, a copper-OSP trench barrier layer 60 may be applied upon the semiconductor wafer 5, etc.

Method 230 may continue by forming a photoresist upon the organic trench barrier layer (block 240). More particularly, photoresist material may be deposited on the copper-OSP layer to form a multi-material trench layer 27. Method 230 may continue by subjecting photoresist material and organic trench barrier layer to lithographic and etching processes (e.g. bake, expose, develop, etc.) to form a trench revealing a portion of the conductive plating layer (block 242). More particularly, a contact trench 66 may be formed by removing a portion of photoprocessing layer 24 and corresponding portion of organic trench barrier layer 60 that exposes a portion of the conductive layer 15. The sidewalls of the remaining portions of photoprocessing layer 24' and trench barrier layer 60' may form the sidewalls of trench 66 and the upper surface of the exposed conductive layer 15 may form the bottom of trench 66. The trench sidewalls may be e.g. refreshed with an etching process (e.g., an oxygen RIE, an argon and oxygen RIE, etc.), a sulfuric acid dip, flux apply and heating to 150 degrees Celsius, flux clean, etc. prior to forming the contact therein.

Method 230 may continue by forming a contact structure within the trench (block 244). For example, contact 30 may be formed by depositing (e.g. electrodeposition plating, etc.) copper within trench 66. An electrodeposition tool may contact conductive layer 15 within perimeter region 40 of wafer 5.

Method 230 may continue with removing photoresist (block 246). For example, photoprocessing layer 24' may be stripped with a photoresist stripping solution. Since the organic barrier trench layer remains, the conductive layer 15 is protected from metal species such as $Cu_3Sn$, $SnO$, $SnO_2$, $Pb$, etc. within the photoresist stripping solution from being deposited thereon by e.g. barrier trench layer 60'.

Method 230 may continue with removing the organic barrier trench layer (block 248). For example, trench barrier layer 60' may be stripped with an etching process (e.g., argon and oxygen RIE, etc.), a flux application heating and flux clean processes, etc. In certain embodiments, such removal process eliminates aggressive nitrogen etches that result in the removal of metal species such as $Cu_3Sn$, $SnO$, $SnO_2$, $Pb$, etc. from the structure that in turn deposits upon chamber walls. Thus, reduced chamber wall kit changes may be achieved. Further, such removal processes may eliminate the need to segregate leaded wafers and non lead wafers during photoresist stripping operations.

Method 230 may continue with removing the barrier layer and/or plating layer exterior to the contact (block 250). For example, the liner 10 and the conductive layer 15 may be removed such that the sidewalls of the liner 10 and the sidewalls of the conductive layer 15 are coplanar with the sidewalls of contact 30. Method 230 ends at block 252.

Figure 14:
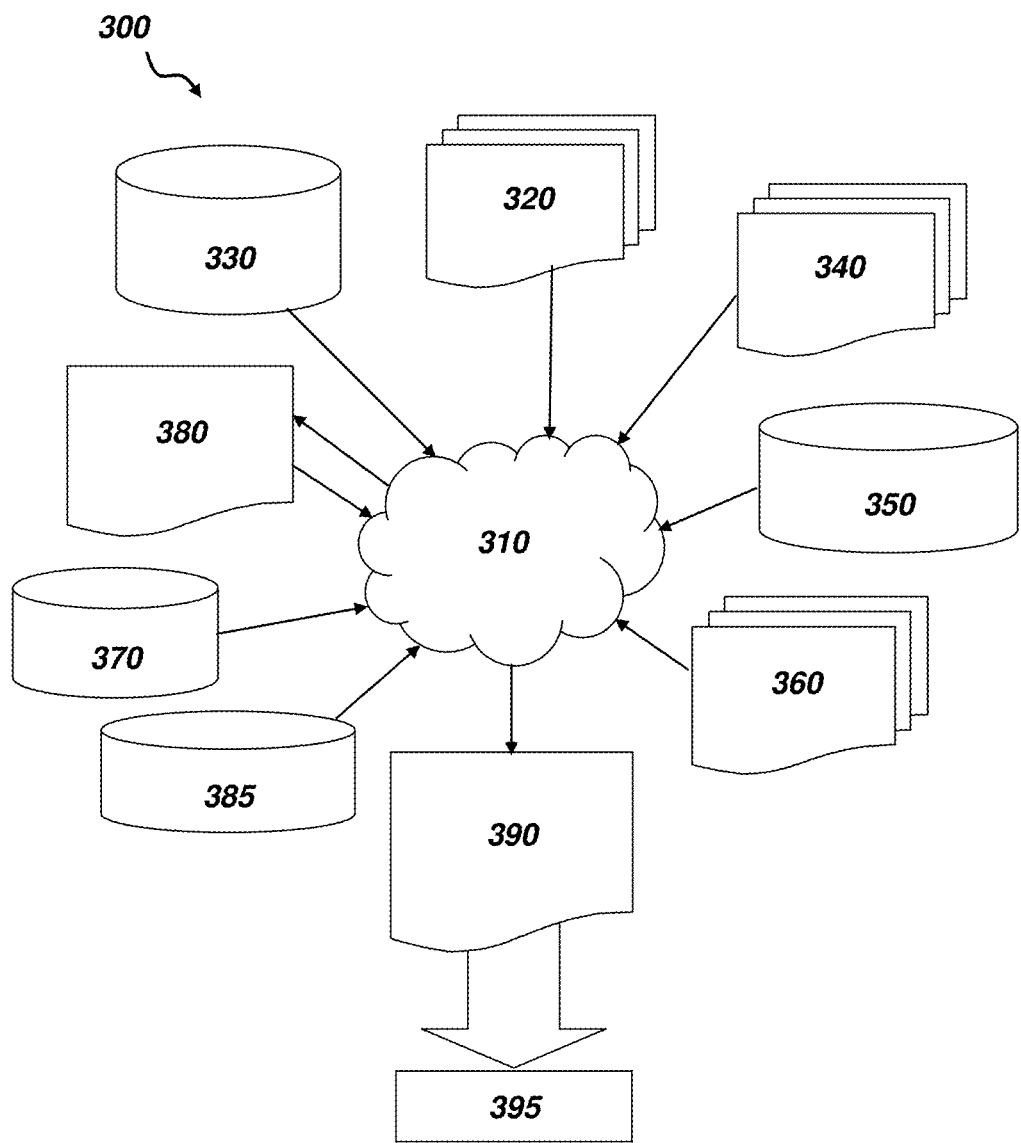
FIG. 14 depicts a flow diagram of a design process used in semiconductor device design, manufacture, and/or test, according to embodiments of the invention.

Referring now to FIG. 14, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIG. 1-11.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIG. 1-11. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIG. 1-11. to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1-11. In one embodiment, design structure 390 may comprise a compiled, executable HDL simulation model that functionally simulates the devices shown in FIG. 1-11.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1-11. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a carrier, with leads that are affixed to a motherboard or other higher level carrier) or in a multichip package (e.g., a carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

References herein to terms such as "vertical", "horizontal", etc. are made by way of example, and not by way of limitation, to establish a frame of reference. The term "horizontal" as used herein is defined as a plane parallel to the conventional plane or surface of a wafer substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device fabrication method comprising:
    forming a liner layer upon a dielectric layer;
    forming an electrically conductive plating layer upon the liner layer;
    forming an epoxy trench barrier layer upon the plating layer;
    forming a photoresist layer upon the epoxy trench barrier layer;
    forming a contact trench within the photoresist layer and the epoxy trench barrier layer,
    wherein the formed contact trench creates photoresist layer portions and epoxy trench barrier layer portions, and wherein the contact trench exposes a portion of the electrically conductive plating layer;
    plating a contact upon the exposed plating layer within the contact trench, and;
    subsequent to plating the contact upon the plating layer within the contact trench,
    removing the photoresist layer portions while maintaining the epoxy trench barrier layer portions.

2. The semiconductor device fabrication method of claim 1, further comprising: subsequent to removing the photoresist layer portions, removing the epoxy trench barrier layer portions to expose the electrically conductive plating layer thereunder.

3. The semiconductor device fabrication method of claim 1, further comprising: removing portions of the electrically conductive plating layer exterior to the contact, such that sidewalls of the electrically conductive plating layer are coplanar with sidewalls the contact.

4. The semiconductor device fabrication method of claim 1, further comprising: removing portions of the liner layer exterior to the contact, such that sidewalls of the liner layer are coplanar with sidewalls the contact.

5. The semiconductor device fabrication method of claim 1, wherein the contact is a pillar.

6. The semiconductor device fabrication method of claim 1, wherein the contact trench is formed by removing a section of the photoresist layer and removing a section of the epoxy trench barrier layer with a single etchant.

7. The semiconductor device fabrication method of claim 1, wherein the photoresist layer and epoxy trench barrier layer have a similar toned photosensitivity.

8. The semiconductor device fabrication method of claim 1, wherein the epoxy barrier layer portions protect the electrically conductive plating layer thereunder from corrosion from metal species within a photoresist stripping solution utilized to remove the photoresist layer portions.

9. A semiconductor device fabrication method comprising:
    forming a liner layer upon a dielectric layer;
    forming an electrically conductive plating layer upon the liner layer;
    forming an organic material (OM) trench barrier layer upon the plating layer;
    forming a photoresist layer upon the OM trench barrier layer;
    forming a contact trench within the photoresist layer and the OM trench barrier layer, wherein the formed contact trench creates photoresist layer portions and OM trench barrier layer portions, and wherein the contact trench exposes a portion of the electrically conductive plating layer;
    plating a contact upon the exposed plating layer within the contact trench, and;
    subsequent to plating the contact upon the plating layer within the contact trench, removing the photoresist layer portions while maintaining the OM trench barrier layer portions.

10. The semiconductor device fabrication method of claim 9, further comprising: subsequent to removing the photoresist layer portions, removing the OM trench barrier layer portions to expose the electrically conductive plating layer thereunder.

11. The semiconductor device fabrication method of claim 9, further comprising: removing portions of the electrically conductive plating layer exterior to the contact, such that sidewalls of the electrically conductive plating layer are coplanar with sidewalls the contact.

12. The semiconductor device fabrication method of claim 9, further comprising: removing portions of the liner layer exterior to the contact, such that sidewalls of the liner layer are coplanar with sidewalls the contact.

13. The semiconductor device fabrication method of claim 9, wherein the contact is a pillar.

14. The semiconductor device fabrication method of claim 9, wherein the contact trench is formed by removing a section of the photoresist layer and removing a section of the OM trench barrier layer with a single etchant.

15. The semiconductor device fabrication method of claim 9, wherein the photoresist layer and OM trench barrier layer have a similar toned photosensitivity.

16. The semiconductor device fabrication method of claim 9, wherein the OM barrier layer portions protect the electrically conductive plating layer thereunder from corrosion from metal species within a photoresist stripping solution utilized to remove the photoresist layer portions.

17. The semiconductor device fabrication method of claim 9, wherein electrically conductive plating layer is copper and wherein the OM barrier layer is an organic solderability preservative that selectively bonds to the conductive plating layer.

* * * * *